(12) United States Patent
Lee et al.

(10) Patent No.: US 8,232,183 B2
(45) Date of Patent: Jul. 31, 2012

(54) PROCESS AND APPARATUS FOR WAFER-LEVEL FLIP-CHIP ASSEMBLY

(75) Inventors: Chien-Hsiun Lee, Hsin-Chu (TW);
Ming-Chung Sung, Taichung (TW);
Clinton Chao, Hsin-Chu (TW);
Tjandra Winata Karta, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 401 days.

(21) Appl. No.: 11/800,387

(22) Filed: May 4, 2007

(65) Prior Publication Data

US 2008/0274592 A1    Nov. 6, 2008

(51) Int. Cl.
*H01L 21/58* (2006.01)

(52) U.S. Cl. ........ 438/459; 438/106; 438/108; 438/109; 438/455; 438/458; 257/E21.499; 257/E21.506; 257/E21.516

(58) Field of Classification Search .................. 438/106, 438/108, 109, 455, 459, 458; 257/E21.499, 257/E21.506, E21.516
See application file for complete search history.

(56) References Cited

U.S. PATENT DOCUMENTS

| | | | |
|---|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |

(Continued)

*Primary Examiner* — Matthew Reames
*Assistant Examiner* — Ermias Woldegeorgis
(74) *Attorney, Agent, or Firm* — Slater & Matsil, L.L.P.

(57) ABSTRACT

A method of forming an integrated circuit structure is provided. The method includes providing an interposer wafer; mounting the interposer wafer onto a handling wafer; thinning a backside of the interposer wafer; removing the handling wafer from the interposer wafer after the step of thinning; securing the interposer wafer on a fixture; and bonding a die on the interposer wafer.

14 Claims, 5 Drawing Sheets

U.S. PATENT DOCUMENTS

| | | |
|---|---|---|
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2003/0166312 A1* | 9/2003 | Lee ................ 438/107 |
| 2004/0063268 A1* | 4/2004 | Noma et al. ........ 438/202 |
| 2004/0115919 A1* | 6/2004 | Takaoka ........... 438/613 |
| 2004/0229398 A1* | 11/2004 | Magerlein et al. ..... 438/106 |
| 2005/0067097 A1* | 3/2005 | Yamamoto et al. ..... 156/344 |
| 2007/0193772 A1* | 8/2007 | Pai ................ 174/260 |

* cited by examiner

PROCESS AND APPARATUS FOR WAFER-LEVEL FLIP-CHIP ASSEMBLY

TECHNICAL FIELD

This invention relates generally to manufacturing processes of integrated circuits, and more particularly to the methods and apparatuses for assembling dies onto interposer wafers.

BACKGROUND

Interposers are used for integrated circuit packaging, typically for routing connections between semiconductor dies and packaging components. For example, semiconductor dies typically have tightly-spaced bonding pads, which may be inconvenient for being bonded onto package substrates. Interposers are thus used to increase the pitches of the semiconductor dies. In this case, interposers each have a first side having copper posts with smaller pitches corresponding to semiconductor dies, and a second side with bonding pads having greater pitches than that of the copper posts.

Conventionally, the interposers are formed using organic materials, ceramics, and the like. Recently, interposers having silicon as the base material are being explored. Silicon interposers have the advantageous features of having the same coefficient of thermal expansion as the silicon substrates in the semiconductor dies. Therefore, smaller stresses are generated between the silicon interposers and the silicon-containing semiconductor dies. In addition, existing technologies are mature enough for forming ultra-thin silicon wafers. However, problems arise in the processing of silicon interposers when the thicknesses of the interposers are reduced to about 5 mils or less, particularly in the future-generation integrated circuits. Such interposer wafers are too thin to handle using conventional packaging techniques.

One method for the handling of ultra-thin interposer wafers is attaching glass wafers using ultra-violet (UV) tapes, and removing the glass wafers after the dies have been attached on the interposer wafers. However, the subsequent reflow process for attaching dies requires temperatures as high as 400° C., which are too high for the UV tape. Accordingly, a new method for handling ultra-thin interposer wafers is needed.

SUMMARY OF THE INVENTION

In accordance with one aspect of the present invention, a method of forming an integrated circuit structure is provided. The method includes providing an interposer wafer; mounting the interposer wafer onto a handling wafer; thinning a backside of the interposer wafer; removing the handling wafer from the interposer wafer after the step of thinning; securing the interposer wafer on a fixture; and bonding a die on the interposer wafer.

In accordance with another aspect of the present invention, a method of handling an interposer wafer includes providing an apparatus, which includes a wafer handler for handling the interposer wafer, wherein the wafer handler comprises a first robot arm for transferring the interposer wafer and a second robot arm for demounting the interposer wafer from a handling wafer; a fixture for placing the interposer wafer, wherein the fixture comprises a flat surface; and a securing device for securing the interposer wafer onto the fixture. The method further includes attaching the handling wafer onto the interposer wafer; thinning a backside of the interposer wafer; demounting the handling wafer from the interposer wafer using the second robot arm; using the first robot arm to flip the interposer wafer so that a front side of the interposer wafer faces down, and transferring the interposer wafer onto the flat surface of the fixture; using the securing device to secure the interposer wafer; and bonding dies onto the interposer wafer.

In accordance with yet another aspect of the present invention, a method of forming an integrated circuit structure includes providing an interposer wafer; mounting the interposer wafer onto a handling wafer using an ultra-violet (UV) tape; thinning a backside of the interposer wafer to expose copper posts in the interposer wafer; placing the backside of the interposer wafer on a vacuum chuck table; exposing the UV tape to UV light; removing the handling wafer from the interposer wafer; flipping and securing the interposer wafer on a fixture; and transporting the interposer wafer using the fixture.

Advantageously, the methods and apparatus provided by the present invention make the handling of ultra-thin interposer wafer possible.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for processing thin interposer wafers and a novel apparatus for performing the same are provided. The intermediate stages of performing the preferred embodiments of the present invention are illustrated. Throughout the various views and illustrative embodiments of the present invention, like reference numbers are used to designate like elements.

Figure 1:
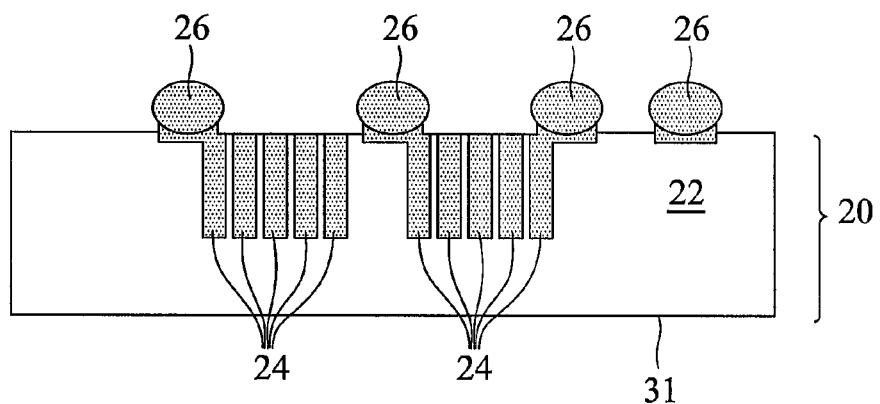
FIGS. 1 through 6B are cross-sectional views of intermediate stages in the handling of an interposer wafer and securing the interposer wafer on a fixture.

Referring to FIG. 1, interposer wafer 20 is provided, which includes base material 22 and copper posts 24 formed therein. In the preferred embodiment, base material 22 includes silicon. In other embodiments, base material 22 includes other commonly used semiconductor or dielectric materials, such as organic materials and ceramics. Copper posts 24 each have a first end buried in base material 22, and a second end connected to a solder bump 26, or solder ball 26, wherein the connection may include metal lines (not shown), vias (not shown) connecting metal lines, and dielectric layers (not shown) in which the metal lines and vias are formed. The first ends of copper posts 24 are arranged to correspond to the bonding pads of semiconductor dies (not shown), which will be bonded to interposer wafer 20 in subsequent process steps.

Figure 2:
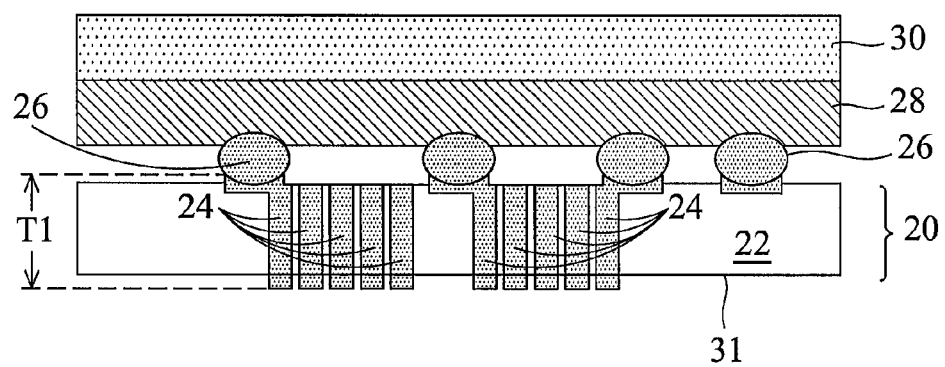

In FIG. 2, handling wafer 30 is mounted on interposer wafer 20 through ultra-violet (UV) tape 28. Throughout the description, handling wafer 30 is alternatively referred to as glass wafer 30 since it is typically formed of glass. Alternatively, handling wafer 30 may be formed of other materials. UV tape 28 is adhesive, and has the characteristics of becoming non-adhesive after exposed to UV light. The back surface 31 of base material 22 (refer to FIG. 1) is then thinned until the first ends of copper posts 24 are exposed. After thinning, the thickness T1 of interposer wafer 20 may be less than about 10 mils, and more preferably less than 5 mils. An etching is then performed to further recess back surface 31 of base material 22, so that a top portion of each of the copper posts 24 stands outside back surface 31.

Figure 3:
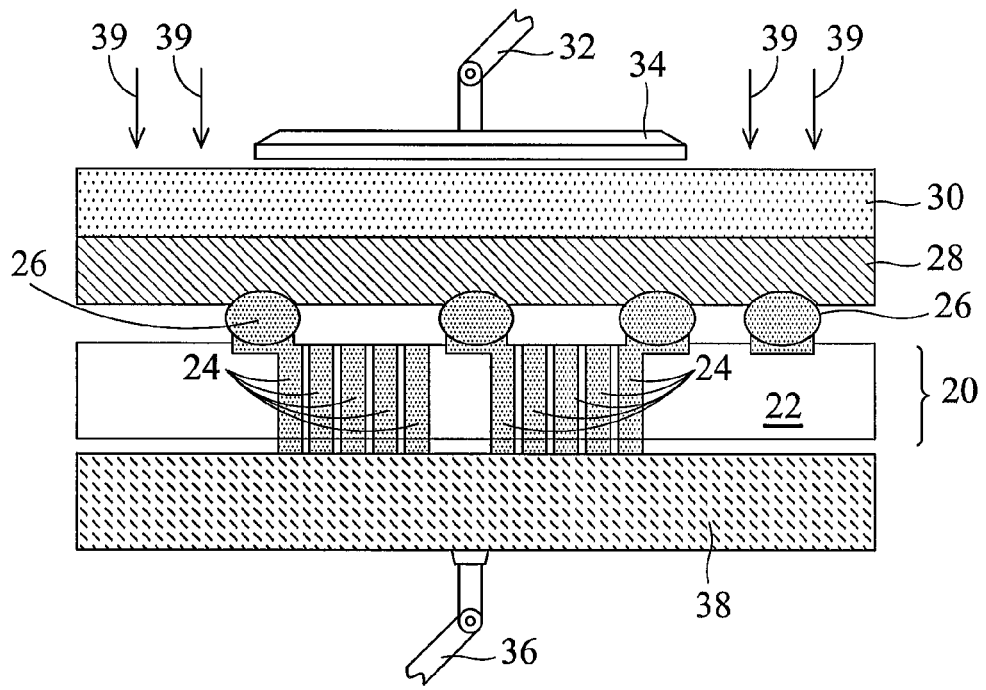
Figure 4:
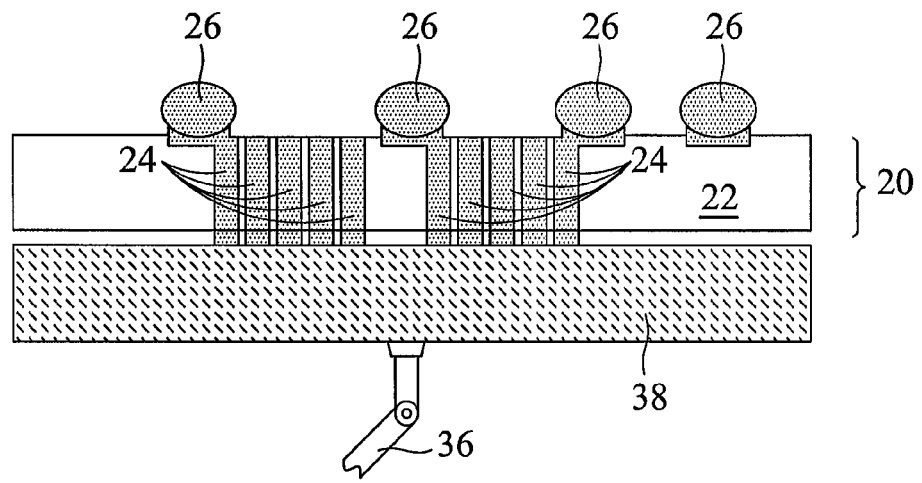

FIG. 3 illustrates the demounting of glass wafer 30. Interposer wafer 20 and the attached glass wafer 30 are transferred to vacuum chuck table 38, which is connected to robot arm 36. With the robot arm 36, vacuum chuck table 38 is movable, and can be flipped upside down. UV tape 28 is exposed to UV light, as is symbolized by arrows 39, so that it becomes non-adhesive. Robot arm 32, which has head 34 for handling glass wafer 30, is then used to demount glass wafer 30 and UV tape 28. During the demounting of glass wafer 30, interposer wafer 20 is secured to vacuum chuck table 38. The resulting structure is shown in FIG. 4.

Figure 5:
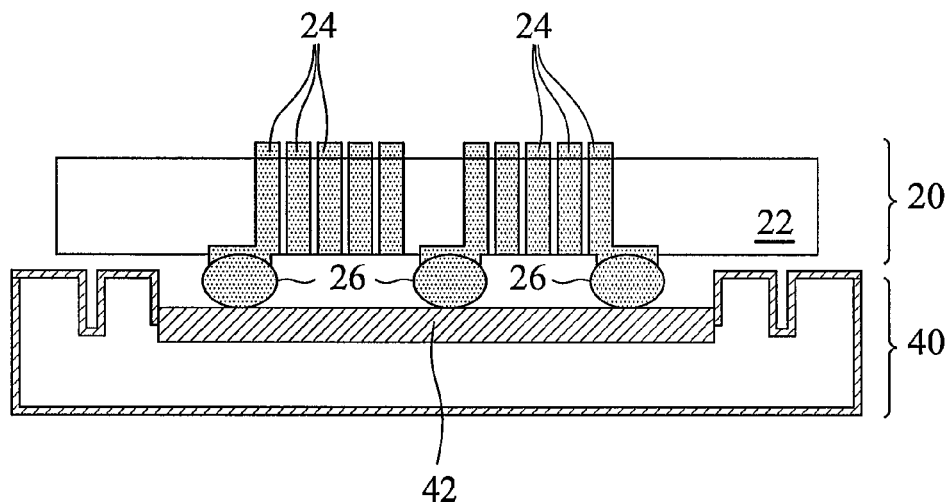

Referring to FIG. 5, after the removal of glass wafer 30 and UV tape 28, robot arm 36 flips interposer wafer 20 upside down, and transfers interposer wafer 20 onto fixture 40, which is used for holding interposer wafer 20 during the subsequent process steps. Robot arm 36 may further rotate interposer wafer 20 so that interposer wafer 20 is placed in desired orientation, wherein notches on interposer wafer 20 may be used to determine the right position. Solder bumps 26 are preferably placed on flat plate 42. Preferably, flat plate 42 comprises insulating materials. More preferably, flat plate 42 is soft enough so that solder bumps 26 are protected from mechanical damage, and hard enough so that interposer wafer 20 is kept substantially flat. In an exemplary embodiment, flat plate 42 is formed of polyimide.

Figure 6A:
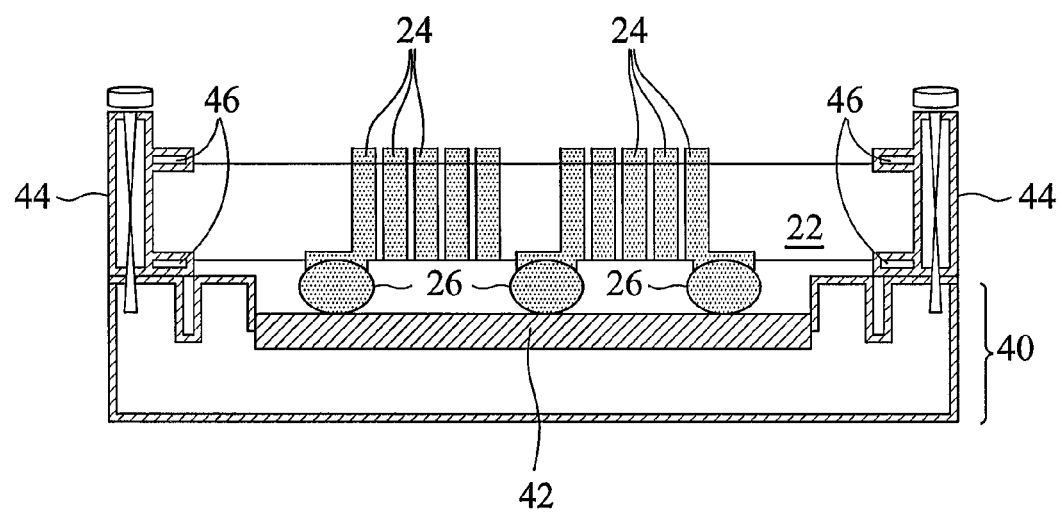
Figure 6B:
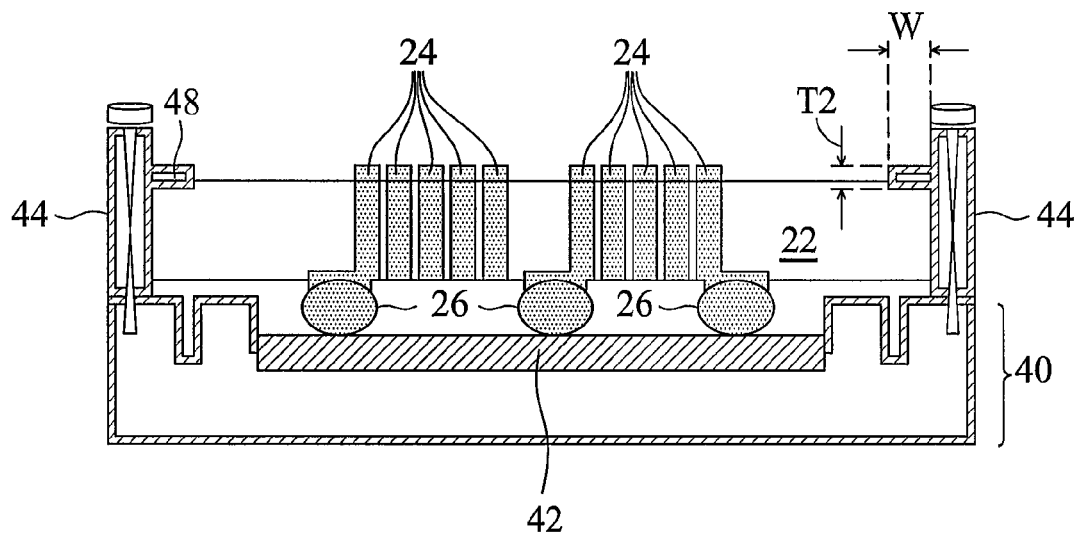

In FIG. 6A, interposer wafer 20 is secured on fixture 40 by auto clipper 44, which comprises pins 46 contacting interposer wafer 20. Pins 46 may hold interposer wafer 20 from the top side and/or the bottom side. Preferably, pins 46 have soft surface materials such as rubber in order to reduce any possible damage to interposer wafer 20. In alternative embodiments, as shown in FIG. 6B, tape 48 is attached onto interposer wafer 20 to hold it in place. Tape 48 may have a ring shape, and is only taped to an outer edge of interposer wafer 20. In an exemplary embodiment, tape 48 has width W of about 5 mm. In the subsequent steps, if a semiconductor wafer, instead of a plurality of dies, is attached to interposer wafer 20, the thickness T2 of tape 48 is preferably less than the height of the solder bumps between the semiconductor wafer and interposer wafer 20, which thickness is preferably less than about 4 mils.

Figure 7:
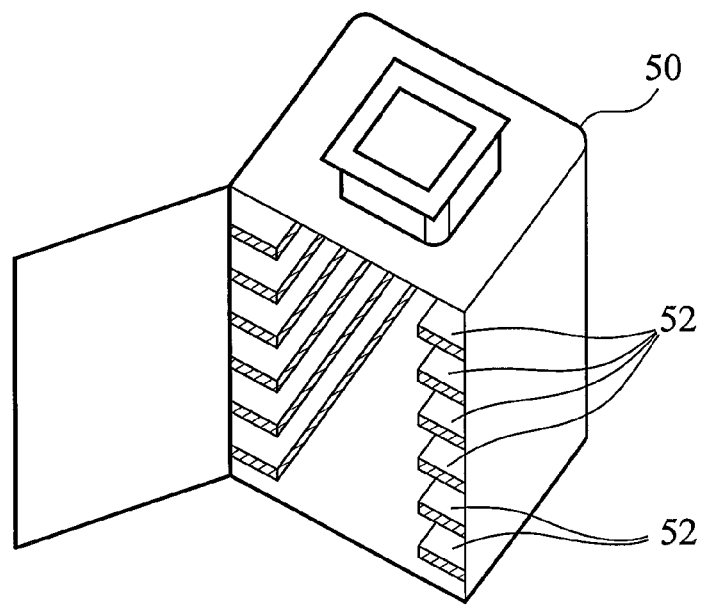
FIG. 7 illustrates an exemplary fixture cassette for holding fixtures.

Fixture 40 provides mechanical support to interposer wafer 20, so that interposer wafer 20 can be handled even if it is thin. Fixture 40 and the attached interposer wafer 20 are treated as an integrated part in the subsequent process steps. For example, for transporting multiple interposer wafers, each of the interposer wafers is secured in one of fixtures 40, and fixtures 40 are placed in a fixture cassette for transporting. FIG. 7 illustrates an exemplary fixture cassette 50, which includes a plurality of racks 52, each for holding one fixture 40. Since fixtures 40 preferably have a rectangular shape (from a top view), and more likely a square shape, racks 52 of fixture cassette 50 are preferably also rectangular shaped. The interposer wafers 20 and their holding fixtures 40 are stored and transported together, until dies are bonded and the interposer wafers are ready for sawing, or until the support to the interposers are no longer needed. For example, after dies are bonded onto the interposer wafers and underfill is dispensed, the strength of the interposer wafers 20 may be great enough to be handled alone without the support of fixture 40.

Figure 8:
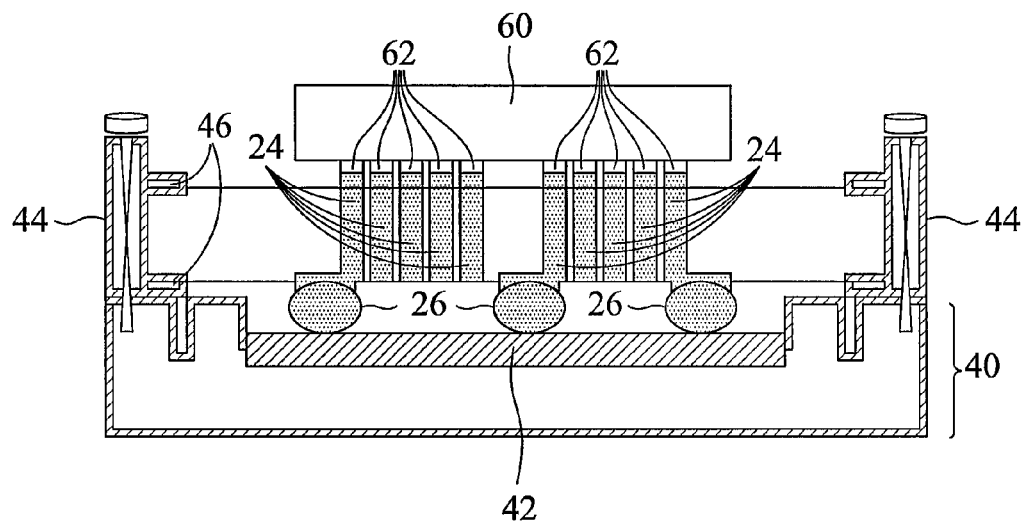
FIGS. 8 and 9 illustrate the bonding of a die onto the interposer wafer.

FIG. 8 illustrates die 60 mounted on interposer wafer 20. Bumps 62, which are pre-attached on die 60, are mounted onto copper posts 24. It is appreciated that although only one die 60 is illustrated, in a practical case, a plurality of dies will be bonded to a plurality of identical interposers in interposer wafer 20. In alternative embodiments, a semiconductor wafer, which includes a plurality of dies, is bonded onto interposer wafer 20. Bumps 62 are then reflowed, bonding die 60 to copper posts 24.

Figure 9:
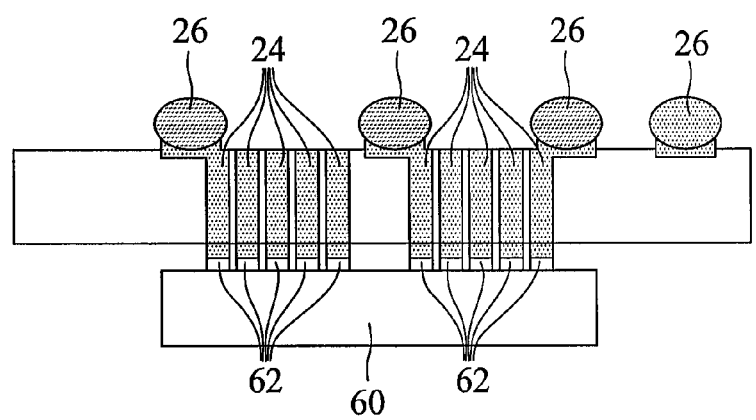

Referring to FIG. 9, interposer wafer 20 and the attaching die 60 are removed from fixture 40 and sawed along scribe lines 64. As a result, the resulting structure includes a plurality of dies 60, each bonded to an interposer 66. The bonded dies may then be used for further packaging, for example, bonded onto package substrates.

The functions for handling interposer wafer 20, as discussed in preceding paragraphs, are preferably integrated into an apparatus. Preferably, the apparatus includes a wafer handler for transferring interposer wafer 20. Robot arms 32 and 36 (refer to FIG. 3), which are capable of transferring, rotating and flipping interposer wafers, are also preferably included in the wafer handler. Furthermore, the wafer handler includes a robot arm capable of demounting glass wafers from interposers. In addition, a wafer notch aligner (not shown) is included in the apparatus for determining the position of interposer wafer 20, so that bumps 62 on die 60 may be accurately bonded onto copper post 24 (refer to FIG. 8). The apparatus further includes fixture 40, auto clipper 44 and fixture cassette 50 (refer to FIG. 7).

The embodiments of the present invention have several advantageous features. With the integrated apparatus, ultra-thin interposer wafers, for example, with thicknesses of less than about 5 mils, can be formed and handled, and dies may be bonded onto the ultra-thin interposer wafers without the concern of breaking the interposer wafers during the handling and transporting processes. With the reduction in the thicknesses of interposer wafers, the thicknesses of the resulting semiconductor packages that include interposers bonded onto dies, are reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
providing an interposer wafer comprising:
    metal features on a first major surface of the interposer wafer; and copper posts inside the interposer wafer and electrically connected to the metal features;

mounting the interposer wafer onto a handling wafer;

thinning a second major surface of the interposer wafer opposite the first major surface until the copper posts are exposed;

demounting the handling wafer from the interposer wafer after the step of thinning;

clipping the interposer wafer onto a fixture, wherein the fixture holds the interposer wafer horizontally and vertically;

bonding a die on the interposer wafer, wherein during the step of bonding the die on the interposer wafer, the interposer wafer is clipped on the fixture; and removing the interposer wafer with the die from the fixture.

2. The method of claim 1, wherein the interposer wafer has a thickness of less than about 10 mils after the step of thinning.

3. The method of claim 1, wherein the step of clipping the interposer wafer onto the fixture comprises:

flipping the interposer wafer upside down so that the first major surface of the interposer wafer faces the fixture;

placing the interposer wafer on the fixture; and clipping the interposer wafer onto the fixture using a clipper.

4. The method of claim 1, wherein the interposer wafer is clipped onto the fixture and transported as an integrated part during an entire period from the step of clipping the interposer wafer to a step of sawing the interposer wafer.

5. The method of claim 1, wherein the step of bonding the die comprises:

placing the die on the interposer wafer with solder bumps on the die against the copper posts in the interposer wafer; and reflowing the solder bumps.

6. The method of claim 1, wherein the die is a portion of a semiconductor wafer.

7. The method of claim 1 further comprising storing the fixture, with the interposer wafer thereon, in a rack of a fixture cassette, wherein the fixture cassette comprises a plurality of identical racks.

8. The method of claim 1, wherein the metal features of the interposer wafer are not bonded to the fixture.

9. A method of forming an integrated circuit structure, the method comprising:

providing an interposer wafer comprising copper posts therein;

mounting the interposer wafer onto a handling wafer using an ultra-violet (UV) tape;

thinning a backside of the interposer wafer until the copper posts in the interposer wafer are exposed;

placing the backside of the interposer wafer on a vacuum chuck table;

exposing the UV tape to UV light;

removing the handling wafer from the interposer wafer;

flipping and clipping the interposer wafer onto a fixture using a clipper, wherein the clipper holds the interposer wafer horizontally and vertically;

transporting the interposer wafer and the fixture as an integrated part; and removing the interposer wafer from the fixture.

10. The method of claim 9, wherein the step of transporting the interposer wafer comprises placing the fixture into a rack of a fixture cassette, wherein the fixture cassette comprises a plurality of identical racks.

11. The method of claim 9, wherein the interposer wafer is clipped onto the fixture during an entire duration between the step of clipping the interposer wafer on the fixture and a step of sawing the interposer wafer.

12. The method of claim 9, wherein the interposer wafer comprises bumps on a front side, and wherein the bumps are mounted to the UV tape.

13. The method of claim 9, wherein the interposer wafer has a thickness of less than about 5 mils after the step of thinning.

14. The method of claim 9 further comprising reflowing bumps between a die and the interposer wafer on the fixture to bond the die to the interposer wafer, wherein during the step of bonding, the interposer wafer is clipped onto the fixture.

\* \* \* \* \*